United States Patent [19]
Anderson

[11] Patent Number: 5,426,565
[45] Date of Patent: Jun. 20, 1995

[54] ELECTRONIC PACKAGE CLAMPING ARRANGEMENT

[75] Inventor: W. Kyle Anderson, Rockford, Ill.

[73] Assignee: Sundstrand Corporation, Rockford, Ill.

[21] Appl. No.: 37,768

[22] Filed: Mar. 26, 1993

[51] Int. Cl.[6] ............................................. H05K 7/20
[52] U.S. Cl. .................................. 361/711; 257/719; 361/707
[58] Field of Search ............... 267/150, 160; 165/80.3, 165/185; 439/485; 257/706, 707, 709, 712, 713, 718, 719; 361/704, 707, 708, 709, 711, 713

[56] References Cited

U.S. PATENT DOCUMENTS

| | | | |
|---|---|---|---|
| 3,921,201 | 11/1975 | Eisele | 357/82 |
| 4,563,725 | 1/1986 | Kirby | 361/388 |
| 5,022,462 | 6/1991 | Flint | 165/80.4 |
| 5,109,317 | 4/1992 | Miyamoto | 361/386 |
| 5,126,829 | 6/1992 | Daiko Ku | 357/82 |
| 5,162,975 | 11/1992 | Matta | 361/386 |
| 5,163,551 | 11/1992 | Bhatia | 206/334 |
| 5,177,667 | 1/1993 | Graham | 361/385 |
| 5,237,485 | 8/1993 | Cognetti | 361/712 |
| 5,283,467 | 2/1994 | Goeschel | 257/718 |

*Primary Examiner*—Gerald P. Tolin
*Attorney, Agent, or Firm*—Marshall, O'Toole, Gerstein, Murray & Borun

[57] ABSTRACT

A clamping arrangement for an electronic package includes a supporting means for supporting an electronic package and a clamping means for clamping the electronic package to the supporting means. The clamping means includes a plurality of springs between a clamping plate and a load distribution plate for evenly applying forces from the clamping plate to the load distribution plate to press the electronic package against the supporting means.

11 Claims, 4 Drawing Sheets

ELECTRONIC PACKAGE CLAMPING ARRANGEMENT

FIELD OF THE INVENTION

The present invention relates to a clamping arrangement for clamping electronic packages to support surfaces, and more particularly to a clamping arrangement for clamping electronic packages to heat sinks.

BACKGROUND OF THE INVENTION

Electronic packages, such as ceramic hybrid packages containing integrated circuits and/or power electronic components, are used in a wide variety of applications. For example, electronic packages are used in variable speed, constant frequency power generation systems. In a variable speed, constant frequency power generation system, a variable speed mechanical input, such as the engine of an aircraft, mechanically drives a generator at a variable speed. Because the generator is being driven at a variable speed, the frequency of its output signal is consequently variable. A variable speed, constant frequency power generation system converts the variable frequency output from a variable speed, mechanically driven generator into constant frequency alternating current for use by alternating current loads.

In a typical variable speed, constant frequency power generation system, a rectifier converts the variable frequency output from a variable speed, mechanically driven generator into a DC signal. An inverter then inverts the DC signal from the rectifier into constant frequency AC output power. Power transistors contained in electronic packages are often used as inverter switches in the inverter of such a variable speed, constant frequency power generation system in order to switch the DC signal, typically a high voltage DC signal, so as to produce pulses at the output of the inverter. These pulses are filtered to produce AC output power having a sinusoidal waveform. The widths of the pulses are typically modulated to regulate the magnitude of the AC output power. Because the power transistors in the inverter carry currents having large magnitudes, these power transistors generate substantial quantities of heat which, if not dissipated, may damage or destroy the power transistors.

Accordingly, the package containing such power electronics as the power transistors used in the inverter of a variable speed, constant frequency power generation system must be clamped or otherwise suitably fastened to a heat transfer surface of a heat sink. A heat sink typically includes a heat transfer surface and a heat exchanger through which cooling fluid flows to draw heat away from supported by the heat transfer surface of the heat sink. In the case of power transistors, the heat transfer surface draws sufficient heat away from the package of the power transistors to protect the power transistors from heat produced damage.

Furthermore, since an electronic package (which is a package containing electronic components such as power transistors) is often fabricated from ceramic, or similar, relatively fragile materials, the electronic package can be damaged by the clamping forces exerted on the electronic package by a clamping arrangement which clamps the electronic package to a heat sink (or other support surface). Thus, in clamping an electronic package to a heat sink, care must be exercised to ensure that these clamping forces are not excessive and are evenly distributed over the electronic package so as to reduce the tendency to fracture or otherwise damage the electronic package; yet, at the same time, an adequate clamping force must be applied to ensure proper thermal conductivity between the electronic package and the heat sink.

The clamping arrangement must also be designed to withstand and absorb any internal hydraulic pressure which may be exerted by the cooling fluid flowing through the heat exchanger of the heat sink on the electronic package; otherwise, this hydraulic pressure could damage the electronic package and/or the clamping arrangement.

SUMMARY OF THE INVENTION

The clamping arrangement of the present invention distributes clamping forces substantially uniformly across the electronic package and exerts adequate, but not excessive, force on the electronic package to insure proper thermal conductivity between the electronic package and the heat sink. Also, the clamping arrangement of the present invention at the same time absorbs, and is strong enough to withstand, the hydraulic pressures of the heat exchanger applied to the clamping arrangement by way of the electronic package.

Therefore, a clamping arrangement according to one aspect of the present invention includes an electronic package, a supporting means for supporting the electronic package, and a clamping means for clamping the electronic package to the supporting means. The clamping means has a pressure applying means for applying a loading pressure to the electronic package in order to press the electronic package against the supporting means and for more evenly distributing the loading pressure over the electronic package.

According to another aspect of the invention, a clamping arrangement includes an electronic package having first and second oppositely disposed housing surfaces. The electronic package has a plurality of load bearing means for bearing loads exerted on the first and second housing surfaces and for transferring loads between the first and second housing surfaces. Electronic components are arranged within the electronic package between the first and second housing surfaces. The clamping arrangement further includes a supporting means for supporting the electronic package wherein the supporting means abuts the second housing surface of the electronic package. A clamping means clamps the electronic package to the supporting means. The clamping means abuts the first housing surface of the electronic package and has a plurality of force applying means for applying a corresponding plurality of forces in order to press the electronic package against the supporting means. The plurality of force applying means are arranged to more evenly distribute the forces pressing the electronic package against the supporting means. Each of the plurality of force applying means is aligned with one of the plurality of load bearing means of the electronic package.

According to yet another aspect of the invention, a method for clamping an electronic package comprises the following steps: (a) supporting the electronic package on a support surface; and (b) clamping the electronic package to the support surface by applying a plurality of forces through a plurality of springs, the forces applying loading pressure to the electronic package in order to press the electronic package against the support surface and each of the forces being applied so as to more evenly distribute the loading pressure over the electronic package.

BRIEF DESCRIPTION OF THE DRAWING

These and other features and advantages will become more apparent from a detailed consideration of the invention when taken in conjunction with the drawing in which.

DETAILED DESCRIPTION

Figure 1:
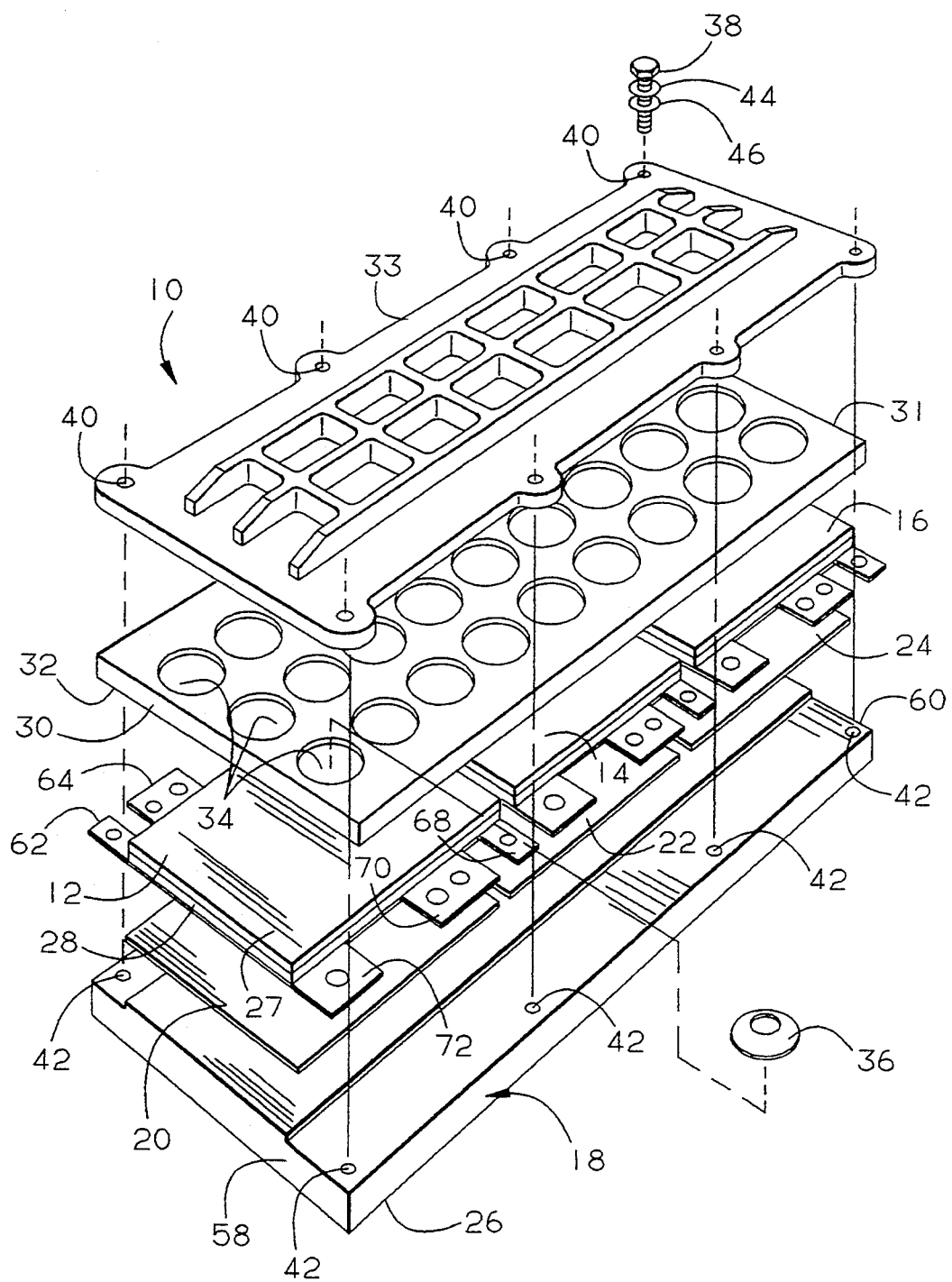
FIG. 1 is an exploded, perspective view of the clamping arrangement according to the present invention.

Shown in FIG. 1 is a clamping arrangement 10 for clamping a plurality of electronic packages 12, 14, and 16 to a supporting means 18 which may include pads or sheets 20, 22, and 24, one sheet for each of the electronic packages. The supporting means 18 may also include a heat sink 26. Each of the electronic packages 12, 14, and 16 has a first surface 27 and a second surface 28. The sheets 20, 22, and 24 are preferably compliant, so that the sheets 20, 22, and 24 conform to the second surface 28 of the electronic packages 12, 14, and 16. The sheets 20, 22, and 24, therefore, conform to any irregularities of the second surface 28 of each of the electronic packages 12, 14, and 16. Also, the sheets 20, 22, and 24 are preferably good thermal conductors, so that the sheets 20, 22, and 24 efficiently conduct heat, which may be generated by the electronic components within the electronic packages 12, 14, and 16, away from the second surface 28 of the electronic packages 12, 14, and 16 and to the heat sink 26.

The material of the compliant and thermally conducting sheets 20, 22, and 24 may be indium. However, gold foil, plated aluminum foil, or any other material may be used as the material for the sheets 20, 22, and 24 so long as whichever material is selected is both compliant and thermally conducting.

The clamping arrangement 10 further includes a load distribution plate 30, which has respective first and second surfaces 31 and 32, and a clamping plate 33. The first surface 31 of the load distribution plate 30 has a plurality of spot-faced sockets or countersinks 34 (hereinafter referred to as recesses) each of which receives a Belleville spring 36. Although only one Belleville spring 36 is shown in FIG. 1, it should be understood that each of the recesses 34 in the first surface 31 of the load distribution plate 30 receives a corresponding Belleville spring 36. Moreover, although nine recesses 34 in the first surface 31 of the load distribution plate 30 are shown in FIG. 1 for each of the electronic packages 12, 14, and 16, any other appropriate number of recesses may be used. Thus, any suitable number of Belleville springs 36 may be used for each of the electronic packages 12, 14, and 16. The clamping plate 33 provides a flat surface for compressing the Belleville springs 36.

Each of the Belleville springs 36 is placed so that its wider end is within a corresponding recess 34 and its narrower end faces the clamping plate 33. A plurality of fastening devices, each of which may be similar to a clamping screw 38 shown in FIG. 1, attach the clamping plate 33 to the heat sink 26. Accordingly, a clamping screw, such as the clamping screw 38 shown in FIG. 1, is inserted through each of a plurality of holes 40 in the clamping plate 33 and are threaded into a corresponding plurality of threaded holes 42 in the heat sink 26. Specifically shown in FIG. 1 are eight pairs of holes 40 and corresponding threaded holes 42 for receiving eight clamping screws such as the clamping screw 38 shown in FIG. 1, although any suitable number of clamping screws 38, holes 40, and threaded holes 42 may be used. If desired, a Belleville washer 44 and a standard washer 46 may be used under the head of each of the clamping screws 38.

Figure 2:
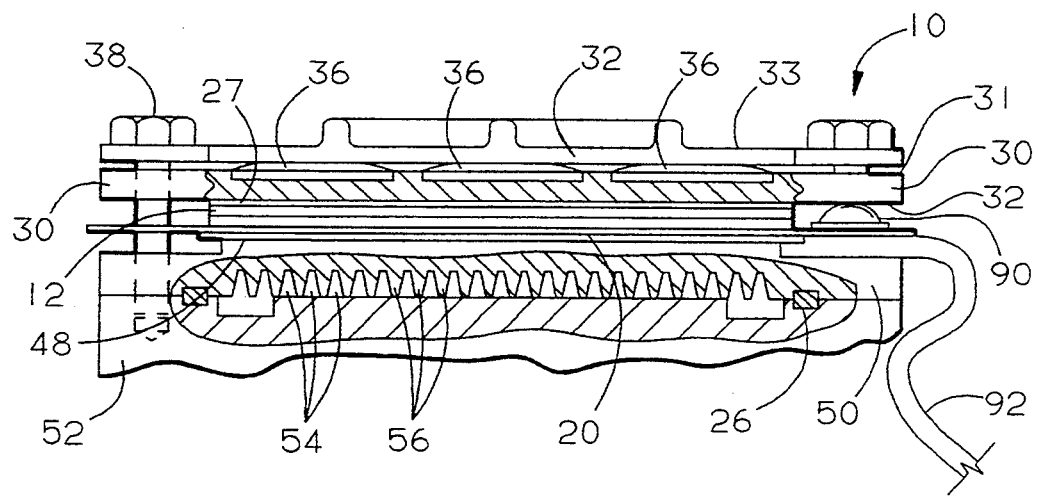
FIG. 2 is a partial cross-sectional frontal view of the clamping arrangement shown in FIG. 1.

As shown in FIG. 2, the clamping arrangement 10 is arranged to clamp each of the electronic packages 12, 14, and 16 to the supporting means 18 which includes the compliant and thermal conducting sheets 20, 22, and 26, and the heat sink 26. Specifically, the clamping screw 38 (which may instead be a nut and stud arrangement) shown in FIG. 2, together with the other clamping screws, are tightened so that the clamping plate 33 applies a clamping force to the first surface 31 of the load distribution plate 30 through the Belleville springs 36. In turn, the load distribution plate 30 transfers this clamping force to the first surfaces 27 of the electronic packages 12, 14, and 16 so that the electronic packages 12, 14, and 16 are pressed into the corresponding compliant and thermally conducting sheets 20, 22, and 26. The electronic packages 12, 14, and 16 are accordingly clamped to a supporting surface 48 of the heat sink 26.

Each of the Belleville springs 36 accordingly transfers the clamping force from the clamping plate 33 to the first surface 31 of the load distribution plate 30 so that the clamping force is uniformly applied, and evenly distributed, by the load distribution plate 30 to the first surfaces 27 of the electronic packages 12, 14, and 16. Moreover, the resiliency of the Belleville springs 36 assures that excessive clamping forces are not applied to the electronic packages 12, 14, and 16. Additionally, the Belleville springs allow the clamping force to be flexible so that a controlled amount of tolerance and deflection related load distribution are accommodated.

As shown in FIG. 2, the heat sink 26 includes an upper plate 50 and a lower plate 52. The upper plate 50 has a plurality of grooves (54) between corresponding projections 56. The upper plate 50, the lower plate 52, the grooves 54, and the projections 56 (which may be, for example, pins) form a heat exchanger to draw heat away from the surface 48 of the heat sink 26. Cooling fluid is circulated through the grooves 54 from one end 58 (see FIG. 1) of the heat sink 26 to its other end 60. Since the cooling fluid flows from the end 58 to the end 60, the pressure of the cooling fluid is higher at the end 58 than at the end 60. Suitable connections (not shown) may be provided to supply this cooling fluid to the grooves 54. This pressure of the cooling fluid within the grooves 54 is in the nature of a hydraulic pressure. Any hydraulic pressure in the upward direction as a result of the cooling fluid flowing through the flow channel 54 is applied to the electronic packages 12, 14, and 16. The Belleville springs may be sized so that their clamping force exceeds the hydraulic pressure.

Figure 3:
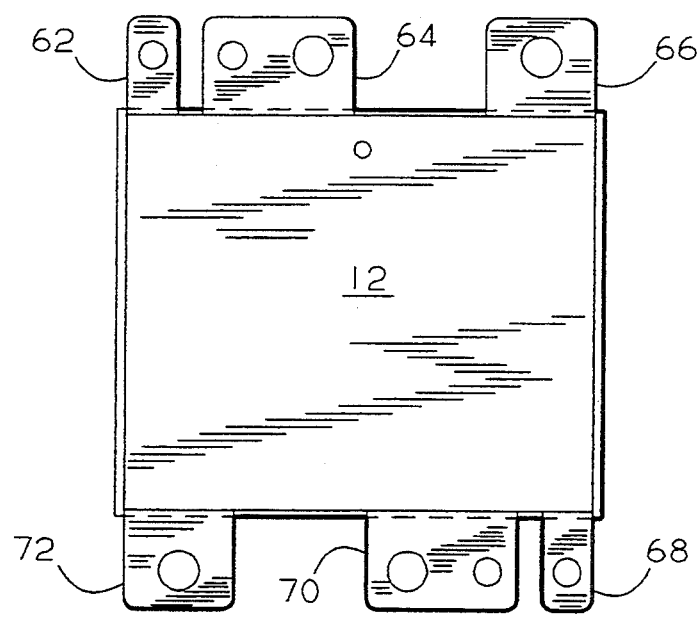
FIG. 3 is a top view of an electronic package which can clamped by use of the clamping arrangement shown in FIG. 1.
Figure 4:
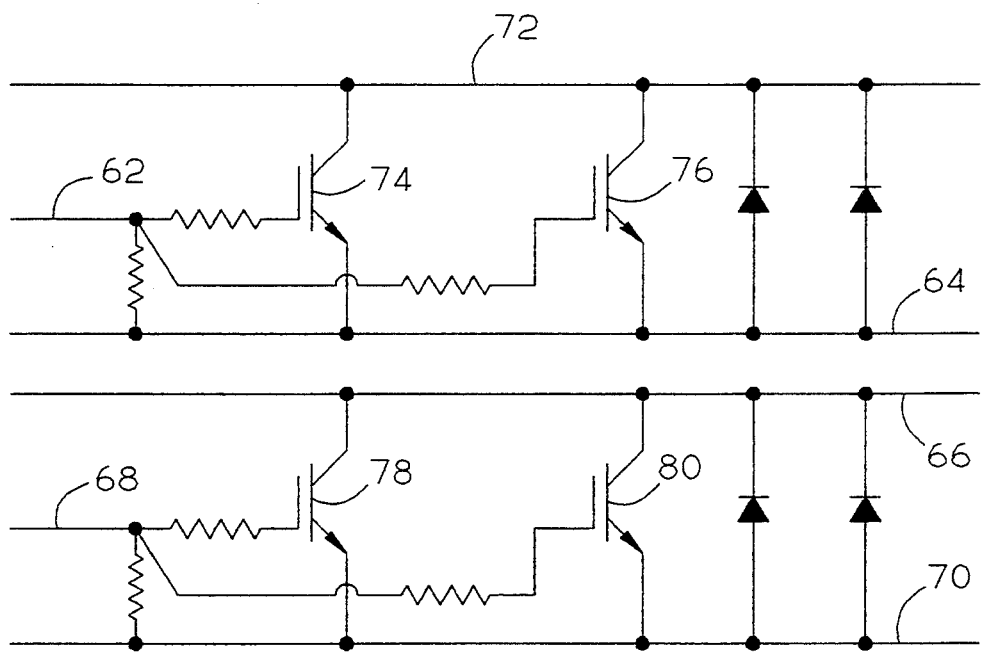
FIG. 4 is an example of electronic components which may be contained in the electronic package shown in FIG. 3.
Figure 5:
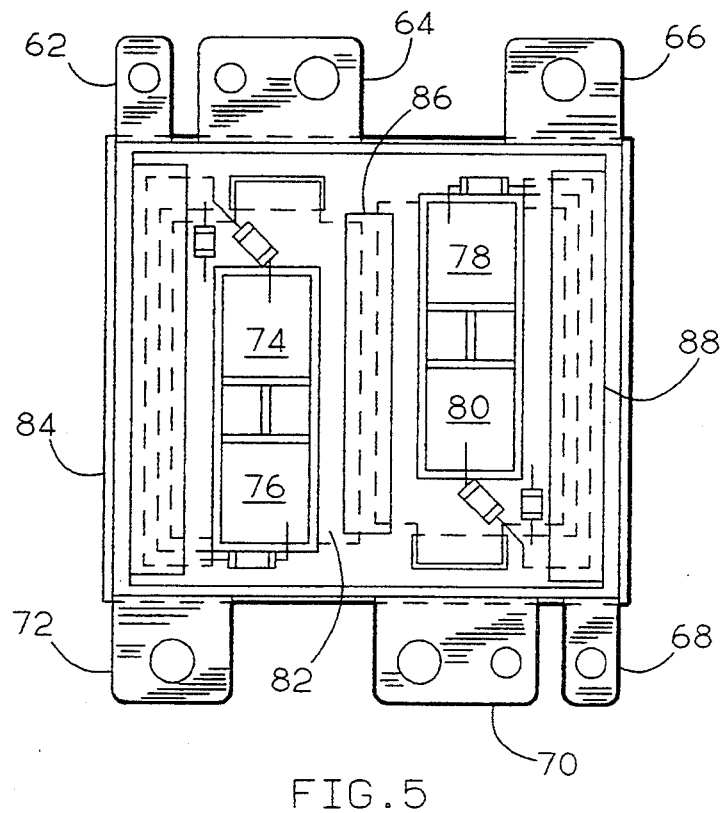
FIG. 5 shows the interior of the electronic package shown in FIG. 3.

One of the electronic packages 12 is shown in FIGS. 3–5. The electronic package 12 includes a plurality of connector tabs 62, 64, 66, 68, 70 and 72. The electronic package 12 further includes a plurality of insulated gate bipolar transistors (IGBTs) 74, 76, 78 and 80 housed within the electronic package 12 between the first and second surfaces 27 and 28 thereof. Circuit paths on a substrate 82 (FIG. 5) interconnect the connector tabs 62, 64, 66, 68, 70 and 72, the IGBTs 74, 76, 78 and 80, and appropriate other components of the electronic package 12 such as resistors and diodes. The first and second surfaces 27 and 28 may be ceramic, or any other similar, relatively fragile Additionally, the substrate 82 may also be ceramic or similar material.

As shown in FIG. 4, the collectors of the IGBTs 74 and 76 are connected to the connector tab 72, the bases of the IGBTs 74 and 76 are connected through appropriate resistors to the connector tab 62, and the emitters of the IGBTs 74 and 76 are connected to the connector tab 64. The collectors of the IGBTs 78 and 80 are connected to the connector tab 66, the bases of the IGBTs 78 and 80 are connected through appropriate resistors to the connector tab 68, and the emitters of the IGBTs 78 and 80 are connected to the connector tab 70.

If the electronic package 12 is used in an inverter, the connector tab 72 may be connected to positive DC, the connector tab 70 may be connected to return or negative DC, the connector tabs 64 and 66 may be connected together to provide an output of the inverter, and the connector tabs 62 and 68 may be connected to suitable control electronics. Accordingly, the IGBTs 74 and 76 of the electronic package 12 are operated in parallel in order to conduct a greater quantity of current than either the IGBT 74 or the IGBT 76 could conduct alone. Similarly, the IGBTs 78 and 80 are operated in parallel in order to conduct a greater quantity of current than either the IGBT 78 or the IGBT 80 could conduct alone.

As best shown in FIG. 5, load bearing means 84, 86, and 88, which may be in the form of load bearing bars, are provided internally to the electronic package 12 and may extend between the first surface 27 and the second surface 28 of the electronic package 12. These load bearing means 84, 86, and 88 may thus be arranged to engage both of the first and second surfaces 27 and 28 of the electronic circuit package 12 in order to transfer the force applied to the surface 27 by the load distribution plate 30 through the electronic package 12 to the second surface 28 thereof. Accordingly, the load bearing means 84, 86, and 88 bear the load applied on the electronic package 12 by the load distribution plate 30 and protect the fragile materials of the electronic package 12 from fracturing or other damage.

The recesses 34 in the first surface 31 of the load distribution plate 30 and the Belleville springs 36 are aligned with the load bearing means 84, 86, and 88 so that the forces exerted by the clamping plate 33 through the Belleville springs 36 are applied to the load bearing means 84, 86, and 88 rather than to the more fragile areas of the first surface 27 of the electronic package 12 between the load bearing means 84, 86, and 88.

In order to clamp the electronic packages 12, 14, and 16 to the heat sink 26, the sheets 20, 22, and 24 are first placed on the surface 48 of the heat sink 26. Next, each of the electronic packages 12, 14, and 16 is placed on a corresponding one of the sheets 20, 22, and 24. Suitable screws, such as a screw 90 shown in FIG. 2, may be used to electrically connect and attach the connector tabs 62, 64, 66, 68, 70, and 72 to appropriate and corresponding leads or bus bars, such as a bus bar 92 shown in FIG. 2. Self-locking threaded nuts may be included in or on the bus bars in order to facilitate the use of screws to attach the connector tabs to the bus bars. A Belleville washer and a standard washer may be provided, if desired, under the heads of these screws. Also, if desired, these screws and bus bars can permit location of the electronic packages 12, 14, and 16 correctly on their corresponding sheets 20, 22, and 24.

Next, the load distribution plate 30 is placed on the first surface 27 of the electronic packages 12, 14, and 16 so that the second surface 32 of the load distribution plate 30 abuts the first surfaces 27 of the electronic packages 12, 14, and 16. Nine Belleville washers 36 are placed in the recesses 34 in the first surface 31 of the load distribution plate 30 for each of the electronic packages 12, 14, and 16. The clamping plate 33 is then placed over the load distribution plate 30 and the Belleville springs 36 and eight clamping screws, such as the clamping screw 38, are inserted through the corresponding holes 40 in the clamping plate 33. A Belleville washer 44 and a standard washer 46 may be inserted under the heads of each of the screws 38.

When the electronic packages 12, 14, and 16 are properly aligned over their corresponding sheets 20, 22, and 24, and when the Belleville springs 36 are properly aligned over the load bearing means 84, 86, and 88 of the electronic packages 12, 14, and 16, the screws 38 are tightened into the threaded holes 42 of the heat sink 26 until the clearance in the washers 44 and 46 is taken up. Each screw 38 is sequentially torqued one turn at a time until any gaps between the Belleville springs 36 and the clamping plate 33 and between the load distribution plate 30 and the electronic packages 12, 14, and 16 are taken up. The screws 90 may then be tightened to their respective connector tabs 64, 66, 68, 70, 72, and 74. Accordingly, clamping forces are evenly distributed over the first surface 27 of each of the electronic packages 12, 14, and 16 to clamp the electronic packages 12, 14, and 16 to the supporting means 18.

Figure 7:
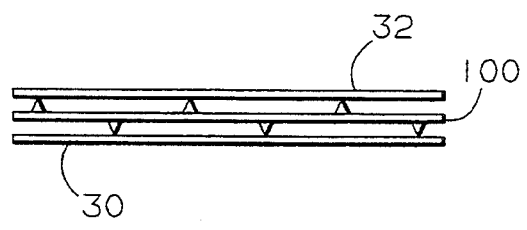
FIGS. 6 and 7 show an alternative force applying and distribution arrangement which can be used in the clamping arrangement shown in FIGS. 1 and 2.
Figure 6:
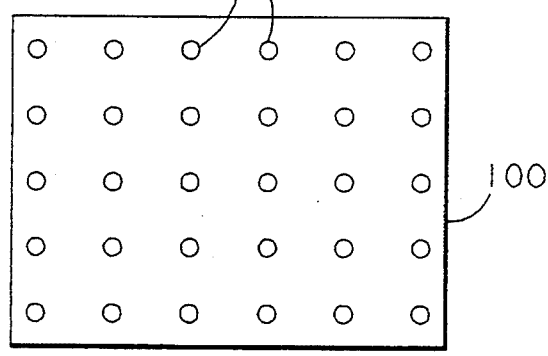

Instead of using the Belleville springs 36, a sheet of compliant material preformed into a series of Belleville springs and/or dimples can be used between the clamping plate 33 and a solid load distribution plate. For example, as shown in FIGS. 6 and 7, a compliant dimple plate 100 has a plurality of dimples 102 on each side thereof. The dimple plate 100 is provided between the clamping plate 33 and a solid load distribution plate 30' and functions in a manner similar to the Belleville springs 36 and the load distribution plate 30. The dimples 102 function as springs and may be arranged so that they align with the load bearing means 84, 86, and 88 of the electronic packages 12, 14, and 16.

Also, although the clamping arrangement 10 has been shown for clamping three electronic packages 12, 14, and 16 to the supporting means 18, any number of electronic packages can be so clamped.

Modifications to the clamping arrangement 10, in addition to those specifically disclosed herein, may also be made without departing from the scope of the present invention, as will be readily apparent to those skilled in the art. Therefore, the scope of the present invention is to be limited only by the claims appended hereto.

I claim:

1. A clamping arrangement comprising:
   an electronic package having first and second surfaces;

supporting means for supporting the electronic package; and clamping means for clamping the electronic package to the supporting means, the clamping means including a clamping plate, the clamping means having pressure applying means for applying a loading pressure to the electronic package in order to press the second surface of the electronic package against the supporting means and for more evenly distributing the loading pressure over the electronic package, the pressure applying means including (i) a load distribution plate having first and second surfaces, wherein the first surface of the load distribution plate includes a plurality of recesses, and wherein the second surface of the load distribution plate abuts the first surface of the electronic package and (ii) a plurality of Belleville springs for applying a plurality of forces to the first surface of the load distribution plate, each of the Belleville springs being located between a corresponding one of the plurality of recesses in the first surface of the load distribution plate and the clamping plate, the clamping plate being arranged to apply force through the Belleville springs to the load distribution plate in order to press the electronic package against the supporting means.

2. A clamping arrangement comprising:

an electronic package having first and second surfaces;

supporting means for supporting the electronic package; and clamping means for clamping the electronic package to the supporting means, the clamping means including a clamping plate, the clamping means having pressure applying means for applying a loading pressure to the electronic package in order to press the second surface of the electronic package against the supporting means and for more evenly distributing the loading pressure over the electronic package, the pressure applying means including (i) a load distribution plate having firs and second surfaces, wherein the second surface of the load distribution plate abuts the first surface of the electronic package, and (ii) a dimpled plate located between the clamping plate and the first surface of the load distribution plate, the dimpled plate having a plurality of dimples each of which transfers a force from the clamping plate to the load distribution plate in order to press the electronic package against the supporting means.

3. The clamping arrangement of claim 2 wherein the dimpled plate is compliant.

4. A clamping arrangement comprising:

an electronic package having first and second surfaces;

supporting means for supporting the electronic package, the supporting means including a heat sink having a heat sink surface, the supporting means further including a sheet of compliant and thermally conductive material abutting both the second surface of the electronic package and the heat sink surface, the sheet of compliant and thermally conductive material conforming to the second surface of the electronic package so as to efficiently conduct heat from the electronic package to the heat sink; and clamping means for clamping the electronic package to the supporting means, the clamping means having pressure applying means for applying a loading pressure to the electronic package in order to press the electronic package against the supporting means and for more evenly distributing the loading pressure over the electronic package, the pressure applying means including (i) a load distribution plate having first and second surfaces, wherein the second surface of the load distribution plate abuts the first surface of the electronic package, and (ii) force applying means for applying a plurality of forces to the first surface of the load distribution plate in order to press the second surface of the electronic package against the supporting means, wherein the force applying means comprises a plurality of springs, and wherein the clamping means comprises a clamping plate, each of the springs acting to transfer a force and being located between the first surface of the load distribution plate and the clamping plate, the clamping plate arranged to apply force through the springs to the load distribution plate in order to press the electronic package against the supporting means.

5. The clamping arrangement of claim 4 wherein the springs comprise a plurality of Belleville springs and the load distribution plate comprises a plurality of recesses in the first surface of the load distribution plate, each of the Belleville springs being located between a corresponding one of the plurality of recesses in the load distribution plate and the clamping plate.

6. A clamping arrangement comprising:

an electronic package having first and second surfaces;

supporting means for supporting the electronic package, the supporting means including a heat sink having a heat sink surface, the supporting means further including a sheet of compliant and thermally conductive material abutting both the second surface of the electronic package and the heat sink surface, the sheet of compliant and thermally conductive material conforming to the second surface of the electronic package so as to efficiently conduct heat from the electronic package to the heat sink; and clamping means for clamping the electronic package to the supporting means, the clamping means having pressure applying means for applying a loading pressure to the electronic package in order to press the electronic package against the supporting means and for more evenly distributing the loading pressure over the electronic package, the pressure applying means including (i) a load distribution plate having first and second surfaces, wherein the second surface of the load distribution plate abuts the first surface of the electronic package, and (ii) force applying means for applying a plurality of forces to the first surface of the load distribution plate in order to press the second surface of the electronic package against the supporting means, wherein the clamping means comprises a clamping plate, and wherein the force applying means comprises a dimpled plate located between the clamping plate and the first surface of the load distribution plate, the dimpled plate having a plurality of dimples each of which acts to transfer a force from the clamping plate to the load distribution plate in order to press the electronic package against the supporting means.

7. The clamping arrangement of claim 6 wherein the dimpled plate is compliant.

8. A clamping arrangement comprising:

an electronic package wherein the electronic package has first and second oppositely disposed housing surfaces, a plurality of load bearing means for bearing loads exerted on the first and second housing surfaces and for transferring loads between the first and second housing surfaces, and electronic components arranged between the first and second housing surfaces;

supporting means for supporting the electronic package, the supporting means including a heat sink, the supporting means further including a sheet of compliant material abutting the second housing surface of the electronic package, the sheet of compliant material conforming to the second housing surface of the electronic package being thermally conductive so as to efficiently conduct heat from the electronic package to the supporting means; and clamping means for clamping the electronic package to the supporting means, the clamping means abutting the first housing surface of the electronic package, the clamping means including a plurality of force applying means for applying a corresponding plurality of forces in order to press the electronic package against the supporting means and for more evenly distributing the forces pressing the electronic package against the supporting means, wherein each of the plurality of force applying means is aligned with one of the plurality of load bearing means of the electronic package, wherein the clamping means comprises a load distribution plate having first and second surfaces, wherein the second surface of the load distribution plate abuts the first housing surface of the electronic package, and wherein the force applying means comprises a plurality of springs and a clamping plate, each of the springs being located between the first surface of the load distribution plate and the clamping plate and being aligned with one of the plurality of load bearing means of the electronic package, the clamping plate being arranged to apply force through the springs to the load distribution plate in order to press the electronic package against the supporting means.

9. The clamping arrangement of claim 8 wherein springs comprise a plurality of Belleville springs and the load distribution plate comprises a plurality of recesses in the first surface of the load distribution plate, each of the Belleville springs being located between a corresponding one of the plurality of recesses in the load distribution plate and the clamping plate.

10. A clamping arrangement comprising:

an electronic package wherein the electronic package has first and second oppositely disposed housing surfaces, a plurality of load bearing means for bearing loads exerted on the first and second housing surfaces and for transferring loads between the first and second housing surfaces, and electronic components arranged between the first and second housing surfaces;

supporting means for supporting the electronic package, the supporting means including a heat sink, the supporting means further including a sheet of compliant material abutting the second housing surface of the electronic package, the sheet of compliant material conforming to the second housing surface of the electronic package being thermally conductive so as to efficiently conduct heat from the electronic package to the supporting means; and clamping means for clamping the electronic package to the supporting means, the clamping means abutting the first housing surface of the electronic package, the clamping means including a plurality of force applying means for applying a corresponding plurality of forces in order to press the electronic package against the supporting means and for more evenly distributing the forces pressing the electronic package against the supporting means, wherein each of the plurality of force applying means is aligned with one of the plurality of load bearing means of the electronic package, wherein the clamping means comprises a load distribution plate having first and second surfaces, wherein the second surface of the load distribution plate abuts the first housing surface of the electronic package, and wherein the force applying means comprises a clamping plate and a compliant dimpled plate located between the clamping plate and the first surface of the load distribution plate, the compliant dimpled plate having a plurality of dimples each of which is aligned with one of the plurality of load bearing means of the electronic package and each of which acts to transfer a force from the clamping plate to the load distribution plate in order to press the electronic package against the supporting means.

11. A clamping arrangement comprising:

an electronic package wherein the electronic package has first and second oppositely disposed housing surfaces, a plurality of load bearing means for bearing loads exerted on the first and second housing surfaces and for transferring loads between the first and second housing surfaces, and electronic components arranged between the first and second housing surfaces;

supporting means for supporting the electronic package, the supporting means abutting the second housing surface of the electronic package; and clamping means for clamping the electronic package to the supporting means, the clamping means including a load distribution plate having first and second surfaces, wherein the second surface of the load distribution plate abuts the first housing surface of the electronic package, the load distribution plate including a plurality of recesses in the first surface of the load distribution plate, the clamping means further including a plurality of Belleville springs and a clamping plate, each of the Belleville springs being located between a corresponding one of the plurality of recesses in the first surface of the load distribution plate and the clamping plate, each of the Belleville springs being aligned with one of the plurality of load bearing means of the electronic package, the clamping plate being arranged to apply force through the Belleville springs to the load distribution plate in order to press the electronic package against the supporting means and to more evenly distribute the forces pressing the electronic package against the supporting means.

* * * * *